United States Patent [19]  [11]  4,141,756
Chiang et al.  [45]  Feb. 27, 1979

[54] METHOD OF MAKING A GAP UV PHOTODIODE BY MULTIPLE ION-IMPLANTATIONS

[75] Inventors: Alice M. Chiang, Weston; Brian W. Denley, Melrose; Jeffrey C. Gelpey, Peabody, all of Mass.

[73] Assignee: Honeywell Inc., Minneapolis, Minn.

[21] Appl. No.: 842,444

[22] Filed: Oct. 14, 1977

[51] Int. Cl.$^2$ .................. H01L 33/00; H01L 21/205; H01L 27/14
[52] U.S. Cl. .................................. 148/1.5; 148/186; 148/187; 357/30; 357/61; 357/91
[58] Field of Search ...................... 357/30, 61; 148/1.5, 148/186, 187; 156/648; 136/89 SG, 89 CC

[56] References Cited

U.S. PATENT DOCUMENTS

| 3,958,265 | 5/1976 | Charmakadze | 357/17 |
| 3,964,940 | 6/1976 | Hart et al. | 148/175 |
| 3,976,872 | 8/1976 | Peterson et al. | 250/211 R |
| 4,001,864 | 1/1977 | Gibbons | 357/30 |
| 4,027,319 | 5/1977 | Borrello et al. | 357/15 |
| 4,034,396 | 7/1977 | Nakamura et al. | 357/30 |

OTHER PUBLICATIONS

Berkeliev et al., "Photodetectors . . . GaAs$_{1-x}$P$_x$. . . ", Sov. Phys. Semicond. (English), vol. 10, (1976), 908.
Beyer et al., "Elimination of Stacking Faults", IBM-TDB, 19 (1977) 3051.
Beyer et al., "Lower Defects . . . in . . . Devices", IBM-TDB, 20 (1977) 1003.
Queisser, "Adv. . . . Optical Analysis of S/C Materials", Appl. Phys. 10 (1976) 275.
Learn et al., ". . . Ion–Impln. on Charges . . . Si/SiO$_2$ System", J. Appl. Phys. 48, (1977) 308.
Hess et al., ". . . Impln. . . . Induced Interface States in Si/SiO$_2$ System," J. Appl. Phys. 48 (1977) 834.

Primary Examiner—L. Dewayne Rutledge
Assistant Examiner—Upendra Roy
Attorney, Agent, or Firm—David R. Fairbairn; Theodore F. Neils

[57] ABSTRACT

An ultraviolet sensitive photodiode is formed in a body of first conductivity type GaP. A region of second conductivity type with a graded impurity distribution is formed in the body, and a thin layer (preferably about 100Å to 300Å) is then removed from the front surface of the body. The removal of the thin layer significantly enhances the performance of the UV sensitive photodiode.

5 Claims, 6 Drawing Figures

METHOD OF MAKING A GAP UV PHOTODIODE BY MULTIPLE ION-IMPLANTATIONS

ORIGIN OF THE INVENTION

The present invention was made in the course of a contract with the Department of the Air Force.

REFERENCE TO CO-PENDING APPLICATIONS

Reference is made to the co-pending application by A. Chiang entitled "GaP Directed Field UV Photodiode" having Ser. No. 842,443 which was filed on even date with this application and which is assigned to the same assignee as the present application. The present invention is a preferred method of fabricating the GaP UV photodiode of the co-pending application.

BACKGROUND OF THE INVENTION

The present invention relates to the fabrication of photodetectors. In particular, the present invention is a method of fabricating a GaP UV sensitive photodiode.

The first consideration in the development of a solid state photodetector is matching the band gap of the detector material to the wavelength region of interest. In the case of solid state ultraviolet detectors, this has presented a serious difficulty since a wide band gap material is required. In general, the wide band gap semiconductor materials have received very little attention and are at a very early stage of development. This has, of course, hindered the development of ultraviolet sensitive solid state sensors.

Of the well-developed semiconductor materials, gallium phosphide (GaP) has the widest band gap (an indirect band gap of 2.24 eV and a direct band gap of 2.8 eV). GaP has found wide use as a material for light emitting diodes, which accounts for its relatively well-developed materials technology in comparison to other wide band gap semiconductor materials.

Because the 2.24 eV indirect band gap of GaP corresponds to a wavelength of 0.55 microns, it has been recognized that visible wavelength photodetectors could be made from GaP. Compared to CdS and other visible wavelength detector materials, however, much less work has been done in investigating the photodetector properties of GaP. Among the references which describe photoconductive properties of GaP in the visible spectrum are G. W. Allen and R. J. Cherry, J. Phys. Chem. Solids, 23, 503 (1962); H. G. Griemmeiss and H. Scholz, Philips Res. Rev., 148, 715 (1966); D. L. Bowman, J. Appl. Phys., 38, 568 (1967); D. F. Nelson et al, Phys. Rev., 135, A1399 (1964); and U.S. Pat. Nos. 3,261,080; 3,412,252; and 3,915,754.

Petersen and Schulze, in U.S. Pat. No. 3,976,872 first reported that under some conditions a usable photoresponse to ultraviolet wavelengths can also be obtained from GaP. The specific device with which Petersen and Schulze made this initial discovery was a photoconductive GaP detector having an asgrown surface.

Subsequently, a GaP Schottky barrier device which exhibited ultraviolet photoresponse was reported in a Russian technical journal: Fiz. Tekh. Poluporev., 8, 410–413 (1974). A Schottky barrier device is a metal-to-semiconductor rectifying contact which forms a potential barrier at the interface between the metal and the semiconductor and creates an internal directed surface field within the semiconductor.

Except for the Petersen and Schulze patent and the Russian technical journal article, there have been no reports of usable ultraviolet photoresponse in GaP. In particular, prior to the present invention, there has been no report of a PN junction GaP photodiode exhibiting usable photoresponse to ultraviolet radiation. A PN junction GaP photodiode exhibiting ultraviolet photoresponse would have several advantages over the specific devices described by Petersen and Schulze, and the Russian technical journal article. First a PN junction device may utilize developed PN junction formation technology. Second a PN junction device may have less stringent surface preparation requirements. Third, a PN junction device has a potentially higher quantum efficiency than a Schottky barrier device because of absorption in the Schottky barrier contact and the potential valley just below the metal-semiconductor interface. Fourth, a PN junction device may be capable of avalanche photodiode operation. Despite these potential advantages, no PN junction GaP photodiode exhibiting ultraviolet photoresponse has been developed.

In recent years, numerous techniques have been developed and investigated for improving the response of visible wavelength solar cells. One technique which has been investigated is the use of impurity gradients in PN junctions to create internal electric field gradients. These internal electric field gradients have improved the quantum efficiency of solar cells by sweeping photogenerated minority carriers away from the surface toward the PN junction. Description of internal electric field gradients in PN junction solar cells may be found in "Photo Effect on Diffused PN Junctions with Internal Field Gradients", I.R.E. Trans. on Electron Devices, ED-7, 242 (1960); B. Ellis and T. S. Moss, "Calculated Efficiencies of Practical GaAs and Si Solar Cells Including the Effect of Built-In Electric Fields", Solid State Electronics, 13, 1 (1970); K. V. Vaidyanathan and G. H. Walker, "The Effect of $Be^+$ Ion Implanted Exponential and Uniform Impurity Profiles on the Electrical Characteristics of GaAs Cells"; and U.S. Pat. No. 4,001,864 by J. F. Gibbons. No ultraviolet response was reported for any of the devices described in these references. In addition, there was no discussion in these references of the use of GaP or the effect which a PN junction with an internal electric field gradient may have on the photoresponse of GaP.

SUMMARY OF THE INVENTION

The method of the present invention produces ultraviolet sensitive GaP photodiodes having high quantum efficiency. A region of second conductivity type is formed in a body of first conductivity type GaP by introducing impurities into the body. The region of second conductivity type is preferably formed by multiple ion implantations at different energies and doses so that a graded impurity distribution is produced.

We have discovered that improved quantum efficiency at ultraviolet wavelengths is achieved if a thin layer is removed from the surface of the body after the region of second conductivity type has been formed. Photodiodes in which the thin layer (which preferably has a thickness between about 100Å and about 300Å) has been removed exhibit superior photoresponse at ultraviolet wavelengths to similar photodiodes in which the thin layer has not been removed.

DETAILED DESCRIPTION OF THE PREFERRED EMBODIMENTS

The present invention is a method of fabricating a GaP UV sensitive photodiode. In particular, the method of the present invention is a preferred method for fabricating the GaP photodiodes described in the co-pending patent application by A. Chiang entitled "GaP Directed Field UV Photodiode."

Figure 1:
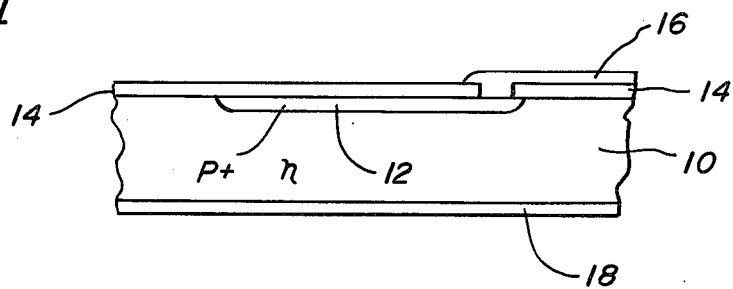
FIG. 1 shows a photodiode formed by the method of the present invention.

FIG. 1 shows a photodiode of the type described in the co-pending Chiang application. The photodiode includes an N type body of GaP 10 which has a shallow (less than 0.5 microns deep) P+ region 12 at the front surface of the detector. The front surface of the detector is covered with an anti-reflection coating 14, and contacts 16 and 18 form ohmic contact to the P+ and N regions 12 and 10, respectively.

In the photodiode of FIG. 1, P+ region 12 has a graded acceptor impurity concentration which decreases essentially monotonically from the front surface of the detector to the PN junction. The result of this graded acceptor concentration is an internal directed surface electrical field which points from the junction to the surface. This electric field repels minority carriers (electrons) from the surface and accelerates them toward the junction.

The effect of the internal directed surface electric field is to overcome the high surface recombination velocity and high UV absorption exhibited by GaP. This high surface recombination velocity severely limits the response of GaP to ultraviolet radiation, since the absorption of ultraviolet radiation occurs within a distance equal to or less than 0.4 microns of the front surface. The internal directed surface electric field repels the photogenerated minority carriers from the surface (and, therefore, the surface recombination centers) and toward the PN junction, where they are collected and contribute to the photosignal.

Figure 2A:
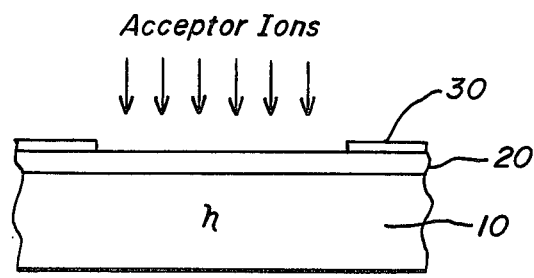
FIGS. 2A–2D illustrate the method of the present invention.

The present invention is a preferred method of fabricating the photodiode of FIG. 1 which results in photodiodes having particularly high quantum efficiencies at ultraviolet wavelengths. In FIG. 2A, an N type body 10 of GaP has a layer 20 of an insulator such as SiO, $SiO_2$, or $Si_3N_4$ deposited on its front surface. A metal mask 30 is formed on insulator layer 20 to define a region of body 10 into which acceptor ions will be implanted.

In a preferred embodiment of the present invention, the desired graded impurity profile is obtained by two or more successive acceptor ion implantations using different doses and different implant energies. This multiple implantation techinque is described generally in the previously mentioned Vaidyanathan and Walker article and Gibbons patent. One implant typically has a higher dose and lower implant energy than the other implantation. The result is a combined impurity profile which provides an essentially exponential acceptor profile within the P+ region.

Figure 2B:
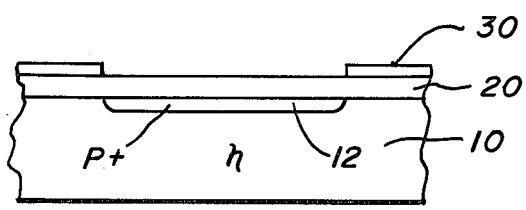

After implantation, an anneal is performed to reduce lattice damage and to activate the implanted ions. FIG. 2B shows P+ region 12 after the anneal has been completed. P+ region 12 is very shallow, with a depth of less than about 0.5 microns.

Figure 2C:
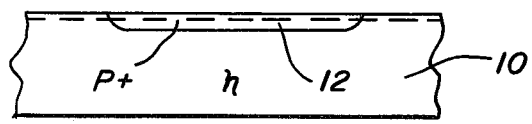

After the anneal has been completed, insulator layer 20 is removed from the surface of the GaP body 10. FIG. 2C shows the photodiode after insulator 20 has been removed.

We have discovered that UV photoresponse of the GaP photodiode is enhanced if a very thin layer is removed from the front surface of body 10 after insulator layer 20 is removed. The dashed line in FIG. 2C illustrates the thin layer which will be removed, preferably by etching. This thin layer is preferably about 100Å to 300Å thick. Removal of less than 100Å or more than 300Å has not proved to be as beneficial to the UV photoresponse of the photodiode.

Figure 2D:
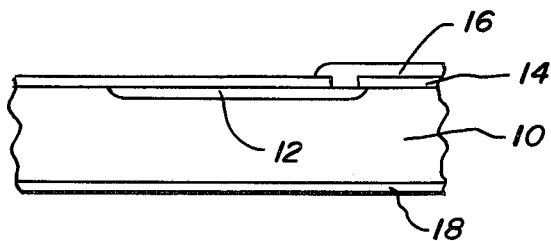

As shown in FIG. 2D, an anti-reflection coating 14 is then deposited on the front surface of the photodiode. Contacts 16 and 18 are formed to provide ohmic contact to P+ region 12 and N type body 10, respectively. In one preferred embodiment, contact 16 is a gold-based zinc alloy and contact 18 is a silver-based tellurium alloy.

Figure 3:
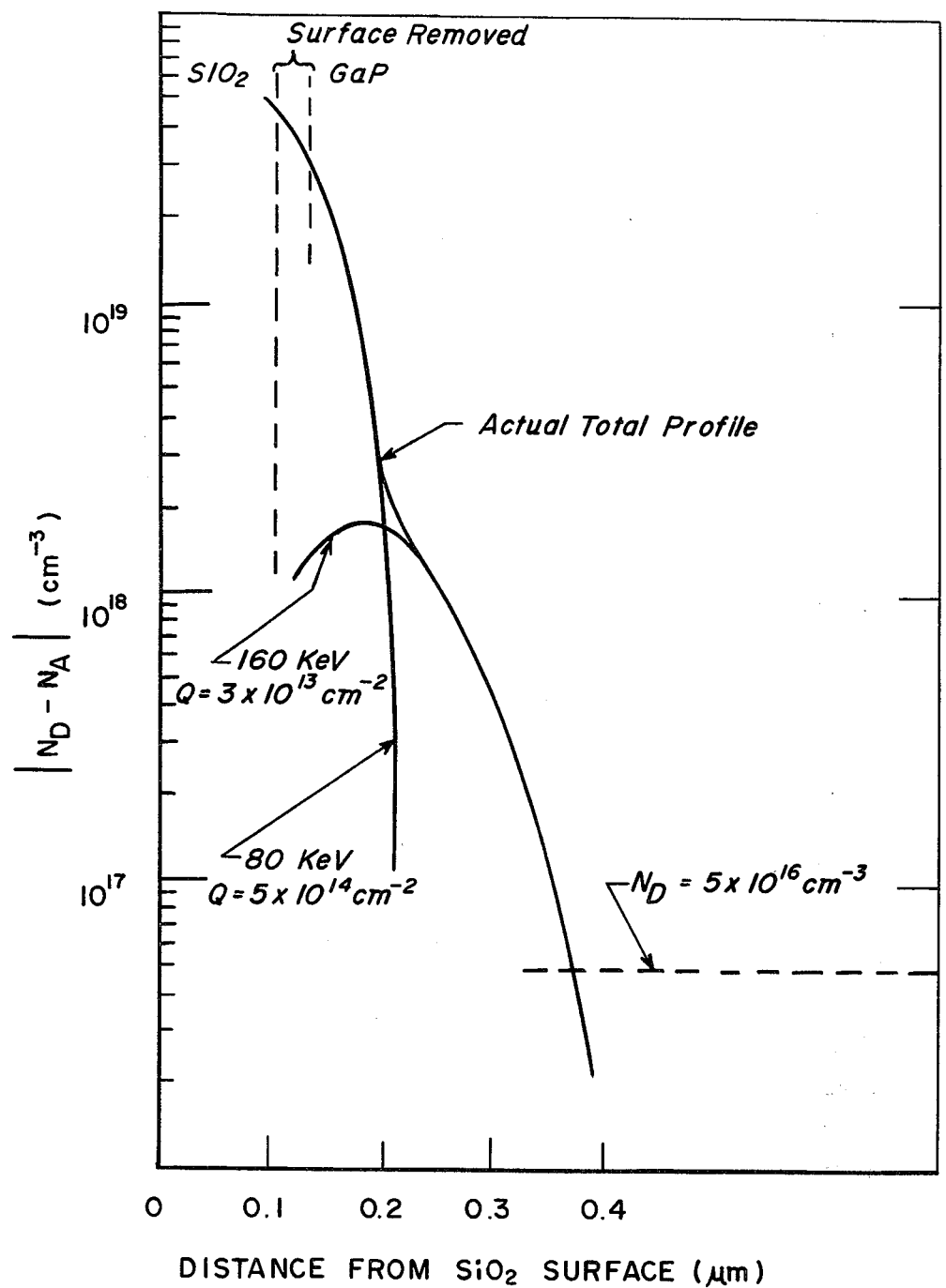
FIG. 3 shows an impurity profile in a GaP photodiode formed by the method of the present invention.

FIG. 3 illustrates the impurity profile of one group of GaP photodiodes fabricated in accordance with the method of the present invention shown in FIGS. 2A–2D. Czochralski grown, (111) oriented, undoped N type GaP wafers having a donor concentration of $5 \times 10^{16}$ cm$^{-3}$ supplied by IMANCO and Metal Specialties were used. Implantations were performed at both 180° C. and 300° C. with subsequent anneals at 850° C. and higher. Insulator layer 20 as $SiO_2$ and had a thickness of about 1000Å. Metal mask 30 was a chromium-gold implant mask. As shown in FIG. 3, the first implantation was at 80 KeV with a dose of $5 \times 10^{14}$ cm$^{-2}$ Mg$^+$ acceptor ions. The second implantation used a higher implant energy (160 KeV) and a lower dose of Mg$^+$ ions ($3 \times 10^{13}$ cm$^{-2}$). The total profile shown in FIG. 3 decreases essentially monotonically from the surface of the GaP to the junction, particularly when 100Å to 300Å (i.e. 0.01 to 0.03 microns) is removed from the surface of the GaP. The junction depth shown in FIG. 3 is slightly less than 0.3 microns.

Other ion doses and implant energies, as well as different implant and anneal temperatures have been used to produce GaP UV photodiodes in accordance with the method of the present invention. By varying implant energies, ion doses, implant temperatures, and anneal temperatures, it is possible to adjust the profile of the impurity acceptor ions within P+ region 12, as well as adjust the total depth of P+ region 12. In each case, however, the best results were obtained when a thin layer was removed from the front surface of the GaP after the implant of the anneal.

Figure 4:
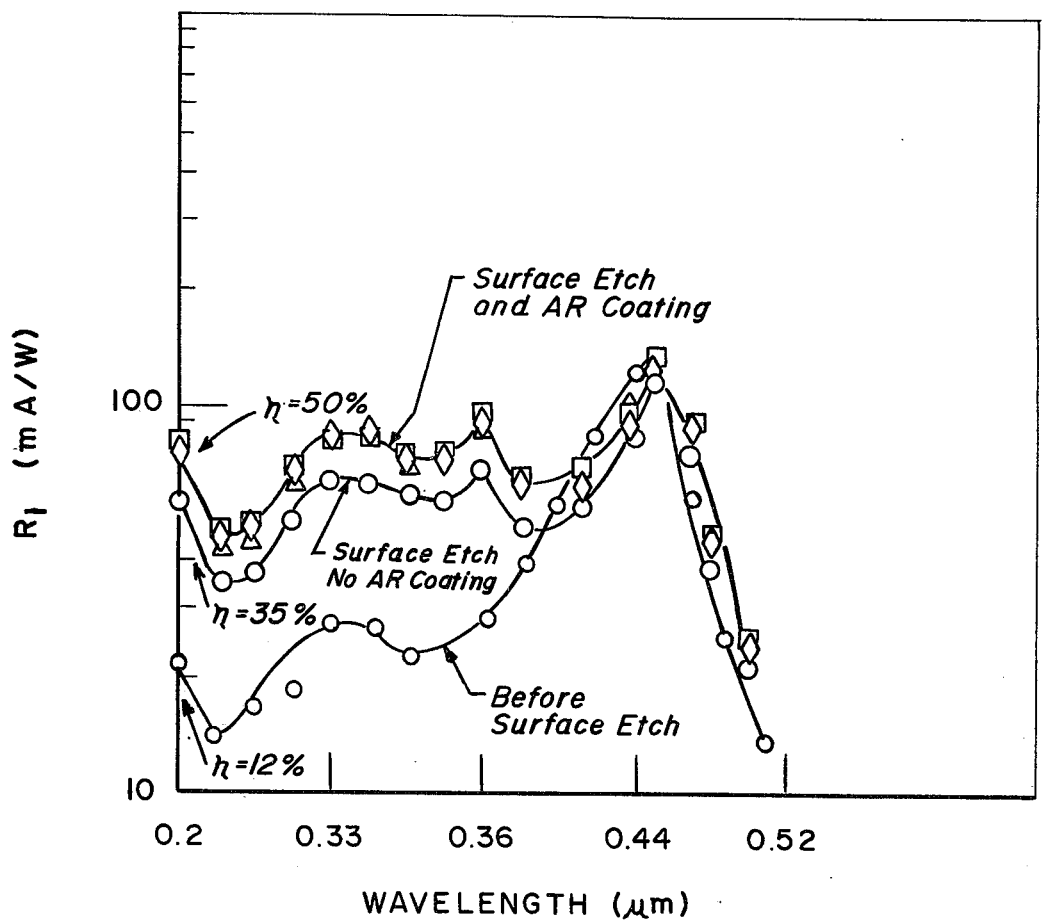
FIG. 4 compares the spectral response of GaP photodiodes in which the thin layer was and was not removed from the front surface.

FIG. 4 illustrates the significant improvement in quantum efficiency at UV wavelengths which is obtained when the thin layer (100Å to 300Å) is removed from the front surface of the detector after junction formation. FIG. 4 shows the spectral response of various GaP photodiodes of the group whose impurity profile is illustrated in FIG. 3.

As shown in FIG. 4, the photodiode that did not have the thin layer removed exhibited significantly reduced UV response with a quantum efficiency of 12% at 0.2 microns. Removal of the thin layer significantly increased the quantum efficiency in all cases. A photodiode having the thin layer removed but no anti-reflection coating exhibited a quantum efficiency of 35% at 0.2 microns, while the photodiodes which had the thin layer removed and had an anti-reflection coating exhibited quantum efficiency of 50% at 0.2 microns.

In conclusion, the method of the present invention produces GaP UV photosensitive photodiodes having high quantum efficiencies. Although the present invention has been described with reference to preferred embodiments, workers skilled in the art will recognize that changes may be made in form and detail without departing from the spirit and scope of the invention. For example, although the present invention has been specifically described with reference to a P+N structure, the method of the present invention may also be used to produce an N+P structure.

The embodiments of the invention in which an exclusive property or right is claimed are defined as follows:

1. A method of forming an ultraviolet sensitive photodiode comprising:
   providing a body of first conductivity type GaP;
   forming a region of second conductivity type proximate a first surface of the body by introducing impurities into the body, the region of second conductivity type having a graded impurity distribution therein;
   removing a thin layer of the body from the first surface to form an ultraviolet radiation receiving surface; and
   making electrical contact to the region of second conductivity type.

2. The method of claim 1 wherein forming a region of second conductivity type comprises ion implanting impurities into the body.

3. The method of claim 2 wherein the thin layer has a thickness of between about 100Å and about 300Å.

4. The method of claim 3 wherein the first conductivity type is N type and the second conductivity type is P type.

5. The method of claim 4 wherein ion implanting comprises ion implanting acceptor ions in a plurality of implantations under different implantation conditions to produce a graded total acceptor impurity distribution.

* * * * *